United States Patent
Lebron et al.

(10) Patent No.: US 7,769,116 B2
(45) Date of Patent: Aug. 3, 2010

(54) METHODS AND APPARATUS FOR SIMULTANEOUS AUTOMATIC GAIN, PHASE AND DC OFFSET CORRECTION IN COMMUNICATION RECEIVERS

(75) Inventors: Agustin Lebron, San Diego, CA (US); Konstantin A. Kouznetsov, San Diego, CA (US); Mehdi Tavassoli Kilani, Irvine, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 902 days.

(21) Appl. No.: 11/605,617

(22) Filed: Nov. 28, 2006

(65) Prior Publication Data

US 2008/0123785 A1 May 29, 2008

(51) Int. Cl.
*H04L 27/08* (2006.01)
(52) U.S. Cl. .................. 375/345; 375/298; 375/319; 375/326; 375/340; 375/346; 455/136; 455/138; 455/296; 455/114.2; 455/114.3; 455/235.1; 455/232.1; 341/155
(58) Field of Classification Search ............. 375/345, 375/319; 455/136, 138
See application file for complete search history.

(56) References Cited

U.S. PATENT DOCUMENTS

| | | | | |
|---|---|---|---|---|
| 4,540,974 A | * | 9/1985 | Schanne et al. | 341/118 |
| 5,005,186 A | * | 4/1991 | Aono et al. | 375/328 |
| 5,761,251 A | * | 6/1998 | Wender | 375/345 |
| 6,901,121 B1 | | 5/2005 | Dubrovin et al. | |
| 2002/0197975 A1 | * | 12/2002 | Chen | 455/324 |
| 2005/0157815 A1 | * | 7/2005 | Kim et al. | 375/302 |
| 2007/0298733 A1 | * | 12/2007 | Cole et al. | 455/114.2 |

FOREIGN PATENT DOCUMENTS

| | | |
|---|---|---|
| DE | 19933266 | 11/2000 |
| WO | WO-00/51254 | 8/2000 |

OTHER PUBLICATIONS

Maxim Integrated Products, Inc., MAX2980 Data Sheet, "Powerline Analog Front-End Transceiver", Jul. 2004, pp. 1-13.
"Partial European Search Report Dated Mar. 2, 2009", European Patent Application No. 07113614.7.
"Extended European Search Report Dated May 26, 2009", European Patent Application No. 07113614.7.

* cited by examiner

*Primary Examiner*—Mohammad H Ghayour
*Assistant Examiner*—Sung Ahn
(74) *Attorney, Agent, or Firm*—Blakely Sokoloff Taylor & Zafman LLP

(57) ABSTRACT

Described herein is a method of automatic gain control and simultaneous digital correction of three types of variations in I/Q receivers: gain imbalance, phase imbalance, and DC offset. Three adaptation loops can operate simultaneously and use the output of an analog to digital converter (ADC) as their input, with the output driving digitally controllable analog components. With appropriate knowledge of signal statistics, the algorithm automatically optimally fills the ADC's full input signal range, providing an automatic gain control function and thus maximizing the signal-to-quantization-noise ratio. In so doing, it corrects gain imbalances between I and Q paths, while additional circuitry corrects DC offsets and phase imbalances.

12 Claims, 5 Drawing Sheets

METHODS AND APPARATUS FOR SIMULTANEOUS AUTOMATIC GAIN, PHASE AND DC OFFSET CORRECTION IN COMMUNICATION RECEIVERS

BACKGROUND OF THE INVENTION

1. Field of the Invention

The present invention relates to the field of communication receivers.

2. Prior Art

In a co-pending application for patent entitled "Adaptation Algorithm Based on Signal Statistics for Automatic Gain Control", filed on Aug. 29, 2001 as application Ser. No. 09/942,298 by Mehdi Tavassoli Kilani et al. and assigned to the assignee of the present invention, a method for accomplishing automatic gain control digitally by using knowledge of signal statistics is described, wherein the adaptation process obtains the statistical characteristics of the received signal to estimate the input signal power level. The estimated input signal power level is used to adjust the gain of a variable gain amplifier for the automatic gain control.

DETAILED DESCRIPTION OF THE PREFERRED EMBODIMENTS

An exemplary receiver in which the preferred embodiments of the present invention may be used may have a low noise amplifier coupled to an antenna, a mixer and filter followed by a variable gain amplifier (VGA) and then an analog to digital converter (ADC). Alternatively, the "mixer" may be two mixers providing I and Q channel outputs, each mixer being followed by a filter and VGA. It is assumed for purposes of this disclosure that each VGA is digitally controlled, though that is not a limitation of the invention. In certain preferred embodiments, the ADC is a 2 bit converter having possible outputs of 00, 01, 10 and 11, though this is not a limitation of the invention. In the description of such an embodiment to follow, the minimum and maximum outputs shall be referred to as the extreme outputs. However as shall subsequently be seen, the present invention is not limited to use with such converters, and may be used with N bit converters where N is any value of two or more.

Gain Control

Gain control is required in modern wireless receivers due to the large variations in signal amplitude caused by unpredictable over-the-air channels. Additional gain variation is caused by intra-receiver component variations, causing a decrease in sensitivity unless corrected.

Figure 4:
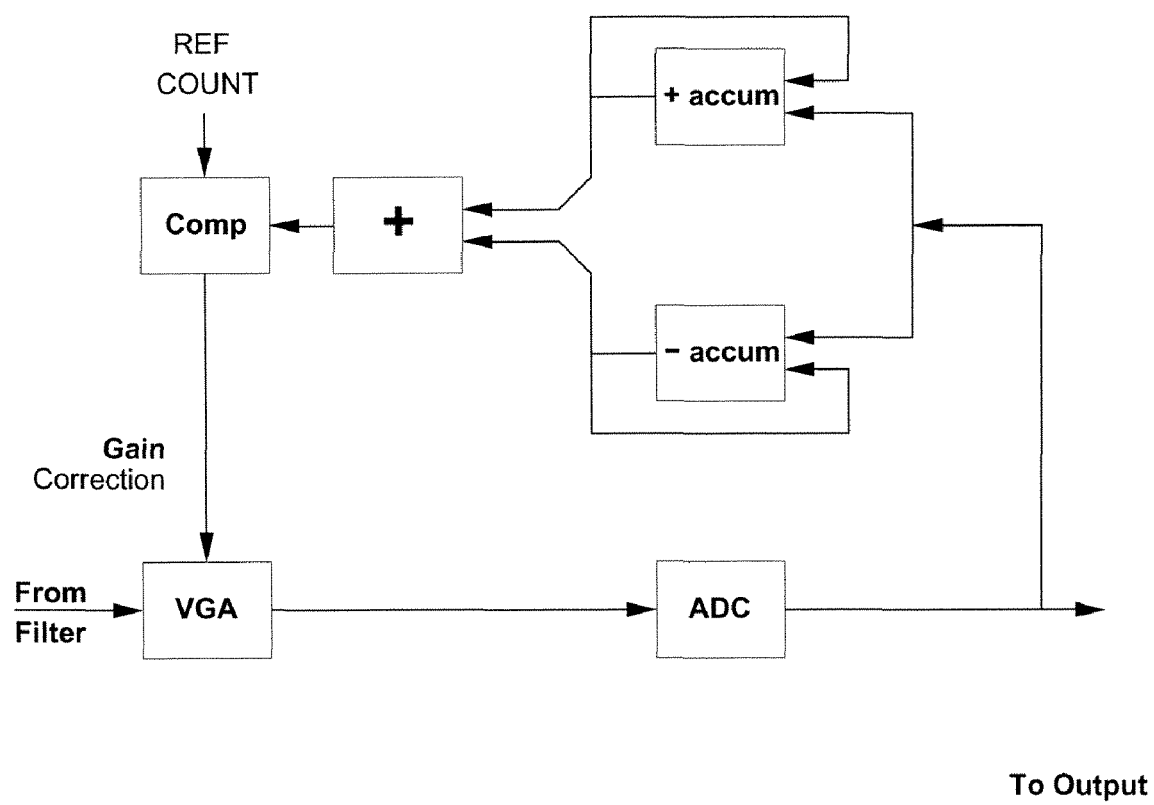
FIG. 4 is a block diagram of the gain control loop for a given channel of a preferred embodiment of the present invention.

In a preferred embodiment, the gain control loop for a given channel operates by counting the number of extreme codes at the output of the ADC in a given time period, as shown in FIG. 4. At the end of this time period, the number of extreme codes is compared (COMP) to a predefined reference level or count (Gain Ref), obtained a-priori by studying the expected signal statistics. If the number of counts exceeds the reference level, the output gain code is decreased to decrease the gain of the VGA. In the preferred embodiment, the gain code is decreased by some number proportional to the excess number of counts. If the count falls short, the gain code is increased, again by an appropriately scaled version of the count-to-reference difference.

Knowing a-priori the statistics of the input signal, the necessary accumulation time and gain control step size can be determined to ensure a given level of gain error. The technique works even when the source signal is dominated by channel noise, since these statistics are also knowable.

By judiciously choosing the above-mentioned scaling factors, and adding hysteresis in the loop, it is also possible to provide immunity to blocking and slow fading conditions common in receivers. In this manner, the gain control loop provides the input of the ADC with a constant-power signal that optimally fills the converter, even under adverse communication conditions.

Inter-Channel Gain Imbalance Correction

Figures 1A, 1B:
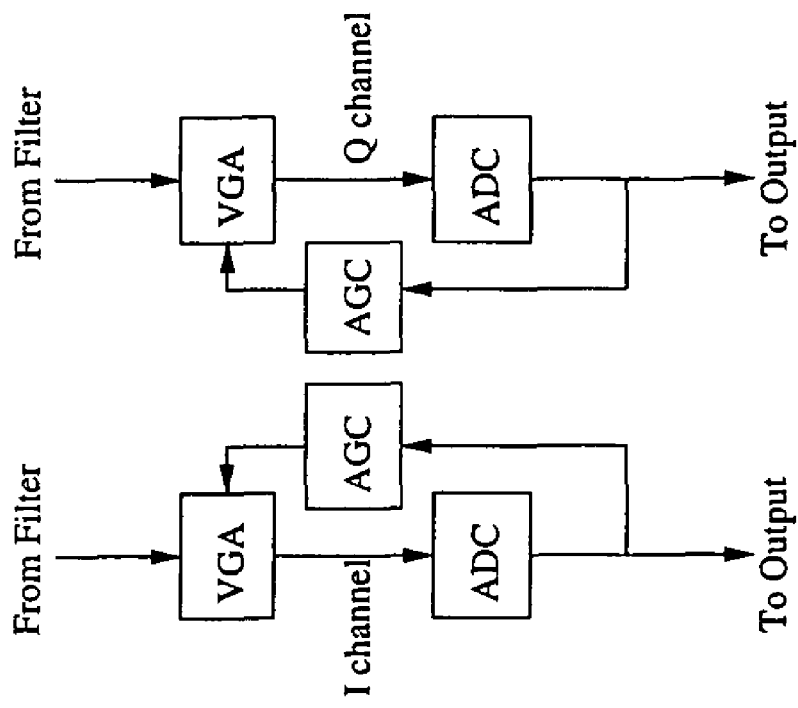
FIG. 1a is a diagram illustrating the use of a digital gain control in receivers having I and Q channels.
FIG. 1b is a diagram illustrating the use of a digital gain control in receivers having I and Q channels in accordance with the present invention.
Figure 1D:
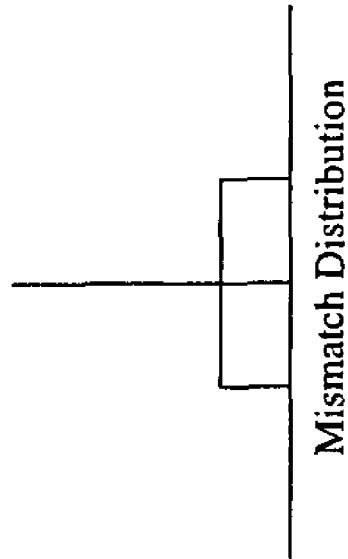
FIG. 1d is a graph illustrating the uniformly distributed statistical parameter characteristic of the gain mismatch in accordance with the present invention, the limits of the distribution being no greater than the minimum step size of the VGA used.
Figure 1C:
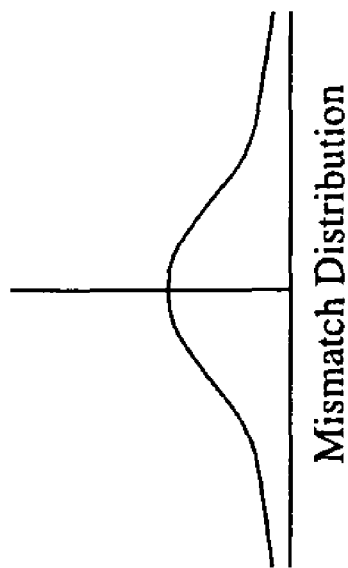
FIG. 1c is a graph illustrating a typical Gaussian characteristic of gain mismatch in accordance with the prior art.

In receivers with both I and Q channel outputs, the gain control scheme described above can also be used to correct gain imbalances arising from component mismatches between the I and Q paths. One known method of gain control in I & Q receivers shown in FIG. 1a provides the same gain voltage or code to both the I and Q sections, relying on analog circuit matching to ensure a match in I and Q channel gain. Alternatively if the above gain control technique is used independently in both channels as shown in FIG. 1b, its self-correcting nature will in fact correct die-to-die analog circuit variations. Instead of the gain mismatch displaying a typical Gaussian characteristic of the prior art shown in FIG. 1c, the mismatch will be a uniformly distributed statistical parameter shown in FIG. 1d, with the limits of the distribution being no greater than the minimum step size of the VGA used. For typical $6\sigma$ process limits, this leads to a significant improvement in gain mismatch.

Due to the randomness of the input signal, the I and Q channels will exhibit the same power over an appropriate accumulation time. Each channel's gain control loop will converge to the same value, and thus the long-term gain error will always be smaller than the minimum gain step size.

DC Offset Correction

In practical receivers, the VGA and ADC circuits exhibit non-zero DC offsets due to parameter mismatches. The large baseband gains typically present in the receiver cause these DC offsets to reduce maximum signal handling capability, hence a DC offset correction scheme is necessary.

Figure 2:
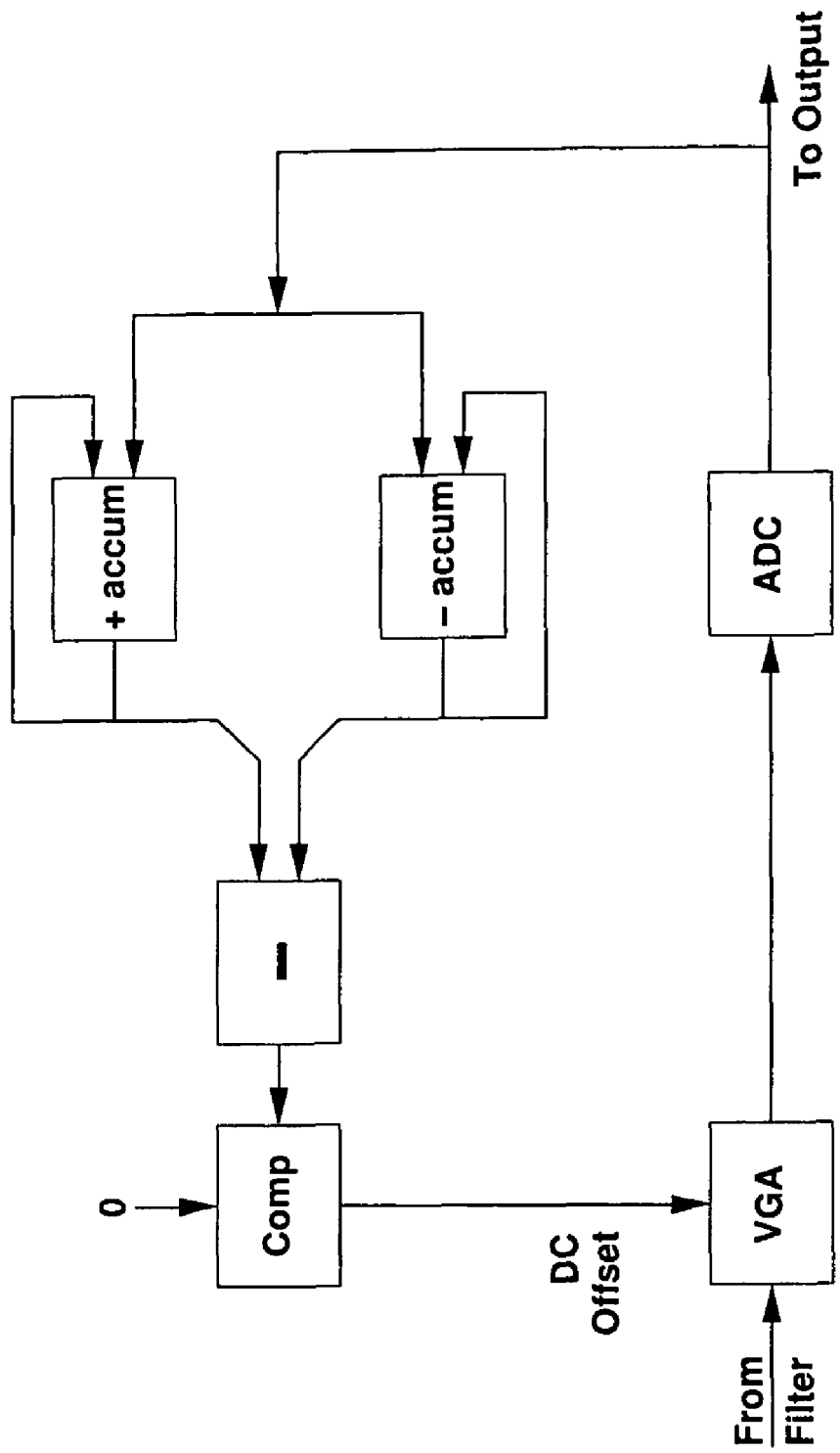
FIG. 2 is a block diagram illustrating DC offset correction in each channel in accordance with the present invention.

The DC offset correction loop of the present invention operates by again counting the number of extreme codes at the output of the ADC. In a preferred embodiment, the registers used in the gain control loop are reused for this purpose. As shown in FIG. 2, the difference between the upper extreme code count and the lower extreme code count over a predefined period of time is, assuming a zero-mean input signal, proportional to the DC offset created by the analog VGA. Thus if the difference is positive, the DC offset correction must bring the DC offset down. If the difference is negative, the DC offset correction must bring the DC offset up. This is done in the compensation circuit Comp. Two such loops are used in a receiver having I and Q channels. The two loops may operate simultaneously, or alternatively one after the other.

When considering small perturbations around the converged value, the DC offset correction is independent of gain control. This is because the two operations which provide the error signal in the two loops (a sum in the case of the gain control loop, a subtraction in the case of the DC control loop) are orthogonal to each other, hence cannot affect each other. In the case of large perturbations of the converged state, the operation of the two loops can be made independent by separating their time constants.

As in the previous two cases, the accumulation time can easily be increased or decreased to capture the true statistics of the input. In the preferred embodiment, this can be done by modifying the counter length, but the invention is not limited to this method.

Phase Imbalance Correction

Figure 3:
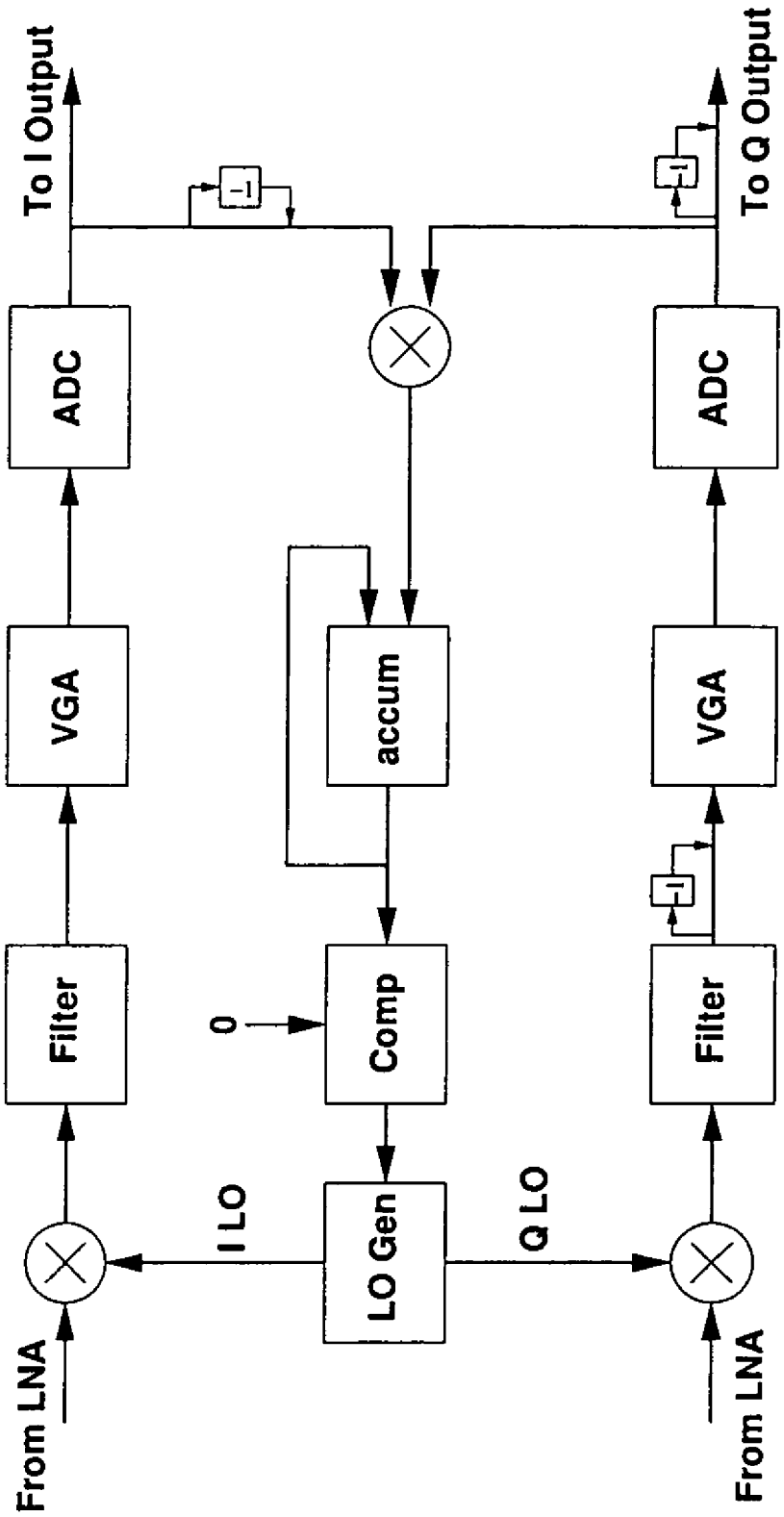
FIG. 3 is a block diagram illustrating an I/Q phase imbalance correction circuit of a preferred embodiment of the present invention.

A phase imbalance correction circuit of a preferred embodiment of the present invention is illustrated in FIG. 3. The phase imbalance correction operates by multiplying the received bits from each of the I and Q downconverter outputs. If there is no phase imbalance, and the signals are uncorrelated, the time-averaged (integrated) product must be zero. If there is a phase imbalance, this will appear as a value proportional to the imbalance and the integration time. To illustrate this, assume two uncorrelated (zero-mean) baseband signals $A(t)$ and $B(t)$ upconverted to some frequency $\omega$ by a transmitter, and transmitted over a perfect channel:

$$F(t) = A(t)\sin \omega t + B(t)\cos \omega t \quad (1)$$

Assuming for the moment no gain or DC offsets, we assume an $\epsilon$ phase error in the quadrature of the LO of the downconversion mixer. Multiplying $F(t)$ with this LO and separating into I and Q paths:

$$I(t) = (A(t)\sin \omega t + B(t)\cos \omega t)\sin \omega t \quad (2)$$

$$Q(t) = (A(t)\sin \omega t + B(t)\cos \omega t)\cos(\omega t + \epsilon) \quad (3)$$

Expanding and filtering out components near $2\omega$, the mixer output appears as:

$$I(t) = \frac{1}{2}A(t) \quad (4)$$

$$Q(t) = \frac{1}{2}A(t)\sin\epsilon + \frac{1}{2}B(t)\cos\epsilon \quad (5)$$

Taking the integral over some time T of the product, we write the error function $E(\epsilon)$:

$$E(\epsilon) = \int_0^T [I(t) \times Q(t)]\, dt \quad (6)$$

$$= \int_0^T \left(\frac{1}{2}A(t)\right)\left(\frac{1}{2}A(t)\sin\epsilon + \frac{1}{2}B(t)\cos\epsilon\right) dt \quad (7)$$

$$= \int_0^T \left(\frac{1}{4}A^2(t)\sin\epsilon + \frac{1}{4}A(t)B(t)\cos\epsilon\right) dt \quad (8)$$

-continued $$= \frac{1}{4}\int_0^T A^2(t)\sin\epsilon\, dt + \frac{1}{4}\int_0^T A(t)B(t)\cos\epsilon\, dt \quad (9)$$

The second term is simply the cross-correlation of the two bitstreams $A(t) B(t)$, which must be zero since they are uncorrelated. The first integral is simply the power of $A(t)$ integrated over T, a known quantity. Writing $\int_0^T A^2(t)dt$ as $P_i$ and using $\sin(\epsilon) \approx \epsilon$:

$$E(\epsilon) = \frac{1}{4}P_i T\epsilon \quad (10)$$

As can be seen, the technique is insensitive to gain imbalances between I and Q channels though not, as will be shown, to DC offsets in each.

In the Presence of DC Offsets

Examining the behavior of the system with unknown DC offsets $\alpha$ in the I channel and $\beta$ in the Q channel (Equations (4) and (5) with the offsets added):

$$I(t) = \frac{1}{2}A(t) + \alpha \quad (11)$$

$$Q(t) = \frac{1}{2}A(t)\sin\epsilon + \frac{1}{2}B(t)\cos\epsilon + \beta \quad (12)$$

Multiplying the two:

$$E_1(\epsilon) = \int_0^T \left[\frac{1}{4}A^2(t)\sin\epsilon + \frac{1}{4}A(t)B(t)\cos\epsilon + \frac{1}{2}\alpha A(t)\sin\epsilon + \frac{1}{2}\alpha B(t)\cos\epsilon + \frac{1}{2}\beta A(t) + \alpha\beta\right] dt \quad (13)$$

The second through fifth terms integrate to zero if $A(t)$ and $B(t)$ are zero-mean and uncorrelated, yielding:

$$E_1(\epsilon) = \frac{1}{4}P_i T\epsilon + \alpha\beta T \quad (14)$$

This term in $\alpha\beta$ cannot be distinguished from the true phase error. To overcome this, integrate the above expression for a half-cycle T (one half the total integration period). During the other half-cycle, integrate the product of the inversion of the Q channel at the VGA input with the inversion of the I channel at the ADC output. Thus note the −1 boxes in FIG. 3, the second inversion in the Q channel returning the signal to its initial polarity, which can be done as part of the downstream processing. Thus, in the second half-cycle:

$$I(t) = -\frac{1}{2}A(t) - \alpha \quad (15)$$

$$Q(t) = -\frac{1}{2}A(t)\sin\epsilon - \frac{1}{2}B(t)\cos\epsilon + \beta \quad (16)$$

Multiplying the two:

$$E_2(\epsilon) = \int_0^T \left[\frac{1}{4}A^2(t)\sin\epsilon + \frac{1}{4}A(t)B(t)\cos\epsilon + \frac{1}{2}\alpha A(t)\sin\epsilon + \frac{1}{2}\alpha B(t)\cos\epsilon - \frac{1}{2}\beta A(t) - \alpha\beta\right]dt \quad (17)$$

Again, the second through fifth terms integrate to zero, giving:

$$E_2(\epsilon) = \frac{1}{4}P_i T \epsilon - \alpha\beta T \quad (18)$$

Averaging (or combining or adding) $E_1(t)$ and $E_2(t)$:

$$E(\epsilon) = \frac{1}{4}P_i T \epsilon \quad (19)$$

Thus the phase error cancellation technique is, to a first order, insensitive to DC offsets.

Correlated I and Q Signals

The phase-correction system described above operates very well with uncorrelated I and Q signals, such as Gaussian noise. When correlation is present, a different technique can be used.

A pilot tone is used to train the receiver before receiving data and the present invention is active only during the pilot tone. A sinusoid of random phase will have orthogonal components in I and Q, so the relevant integral again reduces to zero.

PREFERRED EMBODIMENT OF THE INVENTION

The above-described set of control loops can elegantly be implemented in digital logic, taking as their input the output bits of the ADC, and providing as their output a set of digital words that control the analog blocks to close the loops.

The gain control loop is implemented as a pair of accumulators which count the number of extreme codes in a given time period. At the end of this time period, the sum of the two accumulators is subtracted from a reference bit word. If the difference exceeds some positive threshold, a scaled version of the difference is subtracted from the output gain word. If the difference is smaller than some negative threshold, again a scaled version of the difference is added to the output gain word. In this way, it is possible to control both the gain and hysteresis of the gain loop. A limiter is also used in order to avoid causing overflow and underflow of the gain word.

The DC offset loop takes the same accumulators as the gain control loop but subtracts them. If this number exceeds some positive hysteresis threshold, a scaled version of the difference is subtracted from the output DC offset correction word. Similarly, if the difference is lower than some negative threshold, a scaled version of the difference is added to the output word. This scheme again provides control of the DC loop gain and hysteresis.

The phase imbalance correction loop is implemented with a digital multiplier that multiplies the I channel and Q channel ADC outputs. This value is accumulated in a large register for a given time period. At the end of this time period, the value of the accumulator represents, the positive half-cycle. The input to the Q channel VGA is then inverted using switches, and the output of the I channel ADC is logically inverted. Alternatively, the input to the I channel VGA could be inverted using switches, and the output of the Q channel ADC could be logically inverted before the multiplication. In that regard, the signal that is inverted before the respective VGA should be reinverted at the output of the phase imbalance correction block, or in further signal processing circuitry not shown. Which ever is inverted, the same accumulation is performed for the same time period. At the end of this second period, the value of the accumulator is proportional to the phase imbalance. If this imbalance exceeds some threshold, a scaled version of the accumulator is used to adjust the I/Q balance in the LO or mixer.

Since a typical implementation is largely digital, there are significant savings in power, and the method has an easily programmable tradeoff between accuracy and speed. By eliminating the need for analog power detectors, phase detectors, and DC servo loops, the method also decreases the precision analog content of the receiver, thereby reducing complexity and increasing robustness against implementation inaccuracies. This leads to lower die area, improved yields, and a reduced off-chip component count.

Finally, the method can operate on received data directly. Thus, in most cases, there is no need for a training sequence or other calibration periods that prevent the receiver from being used to receive useful data.

As previously mentioned, the present invention is not limited to use with 2 bit converters, and may be used with N bit converters where N is any value of two or more. In implementations where N is three or more, a code may be considered extreme if it approaches either limit by some predetermined magnitude, such as by way of example, one half or three quarters of its extreme value. Also different predetermined magnitudes might be used for different compensation loops. Further, one may use the same accumulator values for the gain compensation (the sum of the values) as for DC offset compensation (the difference in the values). The time constants may be separated by controlling the amount the gain and DC offset are adjusted in a given correction period, as controlling the loop-gain of a correction loop controls its time constant. In a preferred embodiment, these two loops are intentionally given much different integration times so that they operate independently during startup or in the presence of a large signal disturbance. In that regard, note that the DC offset compensation loop is not sensitive to signal statistics or on orthogonality or signal independence between channels, so may continue to operate after the training time for signals that are not independent or perfectly orthogonal. Otherwise implementation and operation of the invention can remain as described. Whether N is 2 or is more than 2, the accumulators effectively operate as counters.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of phase correction in a communication receiver having in-phase (I) and quadrature (Q) channels, each channel having a variable gain amplifier (VGA) having an output coupled to an analog to digital converter (ADC) providing digital outputs ranging from a lowermost digital value to an uppermost digital value, comprising:

accumulating for a first period of time, the product of the output of the ADC in the I channel and the output of the ADC in the Q channel;

inverting an input of the VGA in a first of the I and Q channels and inverting the output of the ADC in a second of the I and Q channels;

accumulating for a second period of time equal to the first period of time, the product of the output of the ADC in the I channel and the output of the ADC in the Q channel; and, adjusting the phase between the I and Q channels responsive to the sum of the products accumulated during the first and second time periods to reduce the phase error.

2. The method of claim 1 wherein the phase is adjusted in an amount in proportion to the sum of the accumulated products.

3. The method of claim 2 wherein the phase is adjusted in an amount in proportion to the sum of the accumulated products if the accumulated products exceed a predetermined threshold.

4. A method of gain and phase correction in a communication receiver having in-phase (I) and quadrature (Q) channels, each channel having a variable gain amplifier (VGA) having an output coupled to an analog to digital converter (ADC) providing digital outputs ranging from a lowermost digital value to an uppermost digital value, comprising:

for each channel, accumulating for a first period of time, a first count of the number of outputs of the ADC that are equal to or greater than a first upper digital value and accumulating a second count of the number of digital outputs that are equal to or less than a first lower digital value, the magnitude of any difference between the first upper digital value and the uppermost digital value being the same as the magnitude of any difference between the first lower digital value and the lowermost digital value;

if the total of the first and second counts for a channel is less than a predetermined number, increasing the gain of the VGA in the respective channel;

if the total of the first and second counts for one or more channels is more than the predetermined number, decreasing the gain of the VGA in the respective channel;

accumulating for a second period of time, the product of the output of the ADC in the I channel and the output of the ADC in the Q channel;

inverting an input of the VGA in a first of the I and Q channels and inverting the output of the ADC in a second of the I and Q channels;

accumulating for a third period of time equal to the second period of time, the product of the output of the ADC in the I channel and the output of the ADC in the Q channel; and, adjusting the phase between the I and Q channels responsive to the sum of the products accumulated during the second and third time periods to reduce the phase error.

5. The method of claim 4 wherein the phase is adjusted in an amount in proportion to the sum of the accumulated products.

6. The method of claim 5 wherein the phase is adjusted in an amount in proportion to the sum of the accumulated products if the accumulated products exceed a predetermined threshold.

7. A method of direct current (DC) offset and phase correction in a communication receiver having in-phase (I) and quadrature (Q) channels, each channel having a variable gain amplifier (VGA) having an output coupled to an analog to digital converter (ADC) providing digital outputs ranging from a lowermost digital value to an uppermost digital value, comprising:

for each channel, accumulating for a first period of time, a first count of the number of outputs of the ADC that are equal to or greater than a first upper digital value and accumulating a second count of the number of digital outputs that are equal to or less than a first lower digital value, the magnitude of any difference between the first upper digital value and the uppermost digital value being the same as the magnitude of any difference between the first lower digital value and the lowermost digital value;

if the first count is greater than the second count for the channel, decreasing the DC offset for the respective channel;

if the first count is less than the second count for the channel, increasing the DC offset for the respective channel;

accumulating for one half of a second period of time, the product of the output of the ADC in the I channel and the output of the ADC in the Q channel, and for the other half of the second time period, accumulating the product of the inverse of the output of the ADC of one channel and the inverse of the VGA input of the other channel; and, adjusting the phase between the I and Q channels responsive to the combined accumulated during the two halves of the second period to reduce the phase error.

8. The method of claim 7 wherein the digital output is a two bit digital output.

9. A method of gain, direct current (DC) offset and phase correction in a communication receiver having in-phase (I) and quadrature (Q) channels, each channel having a variable gain amplifier (VGA) having an output coupled to an analog to digital converter (ADC) providing digital outputs ranging from a lowermost digital value to an uppermost digital value, comprising:

for each channel, accumulating for a first period of time, a first count of the number of outputs of the ADC that are equal to or greater than a first upper digital value and accumulating a second count of the number of digital outputs that are equal to or less than a first lower digital value, the magnitude of any difference between the first upper digital value and the uppermost digital value being the same as the magnitude of any difference between the first lower digital value and the lowermost digital value;

if the total of the first and second counts for the channel is less than a predetermined number, increasing the gain of the VGA in the respective channel;

if the total of the first and second counts for one or more channels is more than the predetermined number, decreasing the gain of the VGA in the respective channel;

for each channel, accumulating for a second period of time, a third count of the number of outputs of the ADC that are equal to or greater than a second upper digital value and accumulating a fourth count of the number of digital outputs that are equal to or less than a second lower digital value, the magnitude of any difference between the second upper digital value and the uppermost digital value being the same as the magnitude of any difference between the second lower digital value and the lowermost digital value;

if the third count is greater than the fourth count for the channel, decreasing the DC offset for the respective channel;

if the third count is less than the fourth count for the channel, increasing the DC offset for the respective channel;

accumulating for one half of a second period of time, the product of the output of the ADC in the I channel and the output of the ADC in the Q channel, and for the other half of the second time period, accumulating the product of the inverse of the output of the ADC of one channel and the inverse of the VGA input of the other channel; and, adjusting the phase between the I and Q channels responsive to the combined accumulated during the two halves of the second period to reduce the phase error.

10. The method of claim 9 wherein the phase is adjusted in an amount in proportion to the sum of the accumulated products.

11. The method of claim 10 wherein the phase is adjusted in an amount in proportion to the sum of the accumulated products if the accumulated products exceed a predetermined threshold.

12. The method of claim 9 wherein the digital output is a two bit digital output.

* * * * *